(12) United States Patent
Wu et al.

(10) Patent No.: US 9,391,012 B2
(45) Date of Patent: *Jul. 12, 2016

(54) METHODS AND APPARATUS FOR PACKAGE WITH INTERPOSERS

(71) Applicant: Taiwan Semiconductor Manufacturing Company, Ltd., Hsin-Chu (TW)

(72) Inventors: Kai-Chiang Wu, Hsin-Chu (TW);
Hsien-Wei Chen, Hsin-Chu (TW);
Yu-Feng Chen, Hsin-Chu (TW);
Chun-Hung Lin, Taipei (TW);
Ming-Kai Liu, New Taipei (TW);
Chun-Lin Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/638,408

(22) Filed: Mar. 4, 2015

(65) Prior Publication Data
US 2015/0179561 A1   Jun. 25, 2015

Related U.S. Application Data

(63) Continuation of application No. 13/713,034, filed on Dec. 13, 2012, now Pat. No. 8,994,176.

(51) Int. Cl.
*H01L 29/40* (2006.01)
*H01L 23/40* (2006.01)
(Continued)

(52) U.S. Cl.
CPC ........ *H01L 23/49838* (2013.01); *H01L 21/563* (2013.01); *H01L 23/49816* (2013.01); *H01L 25/0657* (2013.01); *H01L 25/105* (2013.01); *H05K 1/0284* (2013.01); *H05K 1/0313* (2013.01); *H05K 1/111* (2013.01); *H05K 1/181* (2013.01); *H01L 23/3128* (2013.01); *H01L 24/05* (2013.01); *H01L 24/11* (2013.01); *H01L 24/13* (2013.01); *H01L 24/16* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/05572* (2013.01); *H01L 2224/1132* (2013.01); *H01L 2224/1144* (2013.01);
(Continued)

(58) Field of Classification Search
CPC ....................................................... H01L 23/48
USPC .......................................... 257/741, 770, 774
See application file for complete search history.

(56) References Cited

U.S. PATENT DOCUMENTS 7,880,310 B2   2/2011   Mathew
8,937,381 B1   1/2015   Dunlap et al.
(Continued)

*Primary Examiner* — Long K Tran
(74) *Attorney, Agent, or Firm* — Slater Matsil, LLP

(57) ABSTRACT

Methods and apparatus for an interposer with dams used in packaging dies are disclosed. An interposer may comprise a metal layer above a substrate. A plurality of dams may be formed above the metal layer around each corner of the metal layer. Dams may be formed on both sides of the interposer substrate. A dam surrounds an area where connectors such as solder balls may be located to connect to other packages. A non-conductive dam may be formed above the dam. An underfill may be formed under the package connected to the connector, above the metal layer, and contained within the area surrounded by the dams at the corner, so that the connectors are well protected by the underfill. Such dams may be further formed on a printed circuit board as well.

20 Claims, 5 Drawing Sheets

(51) Int. Cl.
*H01L 23/498* (2006.01)
*H01L 21/56* (2006.01)
*H01L 25/10* (2006.01)
*H01L 25/065* (2006.01)
*H05K 1/02* (2006.01)
*H05K 1/03* (2006.01)
*H05K 1/11* (2006.01)
*H05K 1/18* (2006.01)
*H01L 23/31* (2006.01)
*H01L 23/00* (2006.01)

(52) U.S. Cl.
CPC ............ *H01L 2224/1145* (2013.01); *H01L 2224/11334* (2013.01); *H01L 2224/11462* (2013.01); *H01L 2224/11849* (2013.01); *H01L 2224/13111* (2013.01); *H01L 2224/13139* (2013.01); *H01L 2224/13147* (2013.01); *H01L 2224/16225* (2013.01); *H01L 2224/26175* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/0651* (2013.01); *H01L 2225/06575* (2013.01); *H01L 2225/1023* (2013.01); *H01L 2225/1058* (2013.01); *H01L 2924/00014* (2013.01); *H01L 2924/01322* (2013.01); *H01L 2924/1431* (2013.01); *H01L 2924/1436* (2013.01); *H01L 2924/1437* (2013.01); *H01L 2924/1443* (2013.01); *H01L 2924/157* (2013.01); *H01L 2924/15311* (2013.01); *H01L 2924/15331* (2013.01); *H01L 2924/15787* (2013.01); *H01L 2924/15788* (2013.01); *H01L 2924/181* (2013.01)

(56) References Cited

U.S. PATENT DOCUMENTS

| | | |
|---|---|---|
| 2006/0038282 A1 | 2/2006 | Lange |
| 2007/0095466 A1 | 5/2007 | Tsuda |
| 2009/0024162 A1 | 1/2009 | Shalaby et al. |
| 2009/0085201 A1* | 4/2009 | Mathew ............ H01L 25/0652 257/734 |
| 2011/0095418 A1 | 4/2011 | Lim et al. |
| 2011/0183267 A1* | 7/2011 | Tsuda .................... H05K 3/108 430/315 |
| 2011/0210436 A1 | 9/2011 | Chow et al. |
| 2011/0260338 A1 | 10/2011 | Lee et al. |
| 2012/0068353 A1 | 3/2012 | Huang et al. |
| 2012/0159118 A1 | 6/2012 | Wong et al. |

* cited by examiner

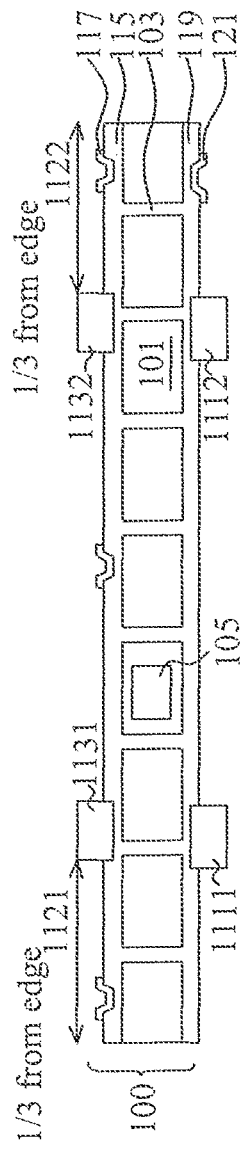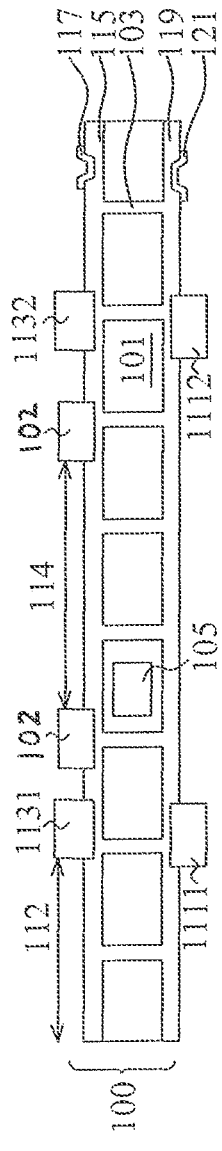

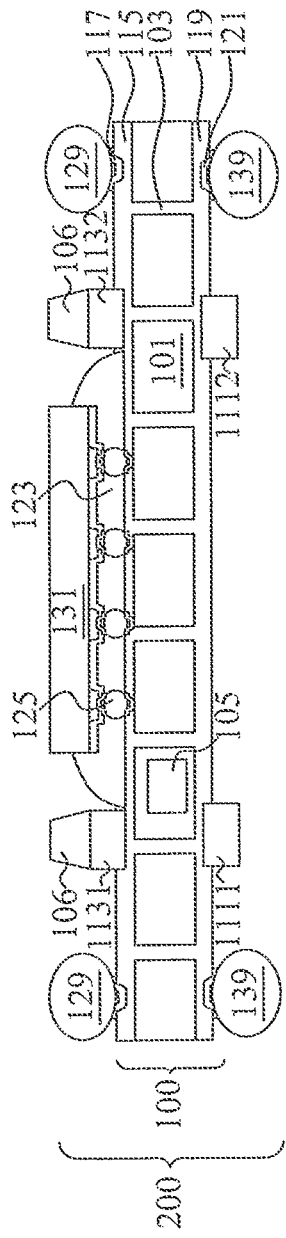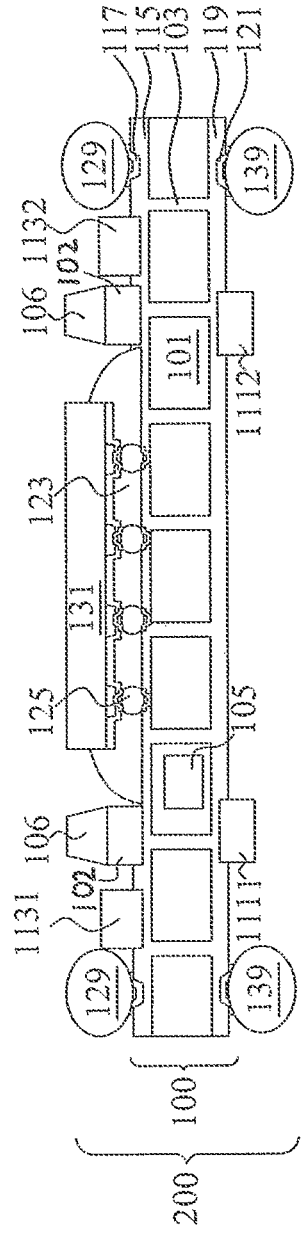

METHODS AND APPARATUS FOR PACKAGE WITH INTERPOSERS

PRIORITY CLAIM AND CROSS-REFERENCE

This application is a continuation of U.S. patent application Ser. No. 13/713,034, filed on Dec. 13, 2012, entitled "Methods and Apparatus for Package with Interposers," which application is hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. These smaller electronic components also require smaller packages that utilize less area than previous packages. Some smaller types of packages for semiconductor devices include quad flat pack (QFP), pin grid array (PGA), ball grid array (BGA), flip chips (FC), three dimensional integrated circuits (3DICs), wafer level packages (WLPs), and package on package (PoP) devices.

A 3DIC may be formed by stacking two IC dies above each other to achieve a smaller size package. One type of 3DIC is the package-on-package (PoP) structure, wherein multiple dies coupled to respective substrates can be stacked above each other. A first die is electrically coupled to a first substrate to form a first circuit. The first circuit includes first connection points for connecting to a second circuit. The second circuit includes a second die and a second substrate having connection points on each side of the substrate. The first circuit is stacked and electrically coupled above the second circuit to form the PoP structure. The PoP structure can then be electrically coupled to a PCB or the like using electrical connections.

Another type of 3DIC is formed using a silicon interposer substrate (either passive or active) to provide much finer die-to-die interconnections, thereby increasing performance and reducing power consumption. In these situations, power and signal lines may be passed through the interposer by way of through vias (TVs) in the interposer. For example, one die is bonded above another with the lower die being coupled to the interposer using contact pads located on the interposer. The contact pads can then be electrically coupled to a printed circuit board (PCB) or the like using electrical connections.

In a 3DIC package, an underfill material may be used between a die and a substrate, an interposer, or a PCB, to strengthen the attachment of the die to the substrate, the interposer, or the PCB, and to help to prevent the thermal stresses from breaking the connections between the die and the substrate, the interposer, or the PCB. However, the underfill material may not protect connections well for connectors located at the corners of a package due to the capillarity for four corner underfill dispensing, which may leave some connectors unprotected by the underfill material. Methods and apparatus are needed to help to protect the connectors at four corners of a package with underfill materials while forming semiconductor packages.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1(a)-1(d) illustrate cross-sectional views of an embodiment of an interposer with a dam formed around each corner of the interposer and a package formed with the interposer;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 2A:
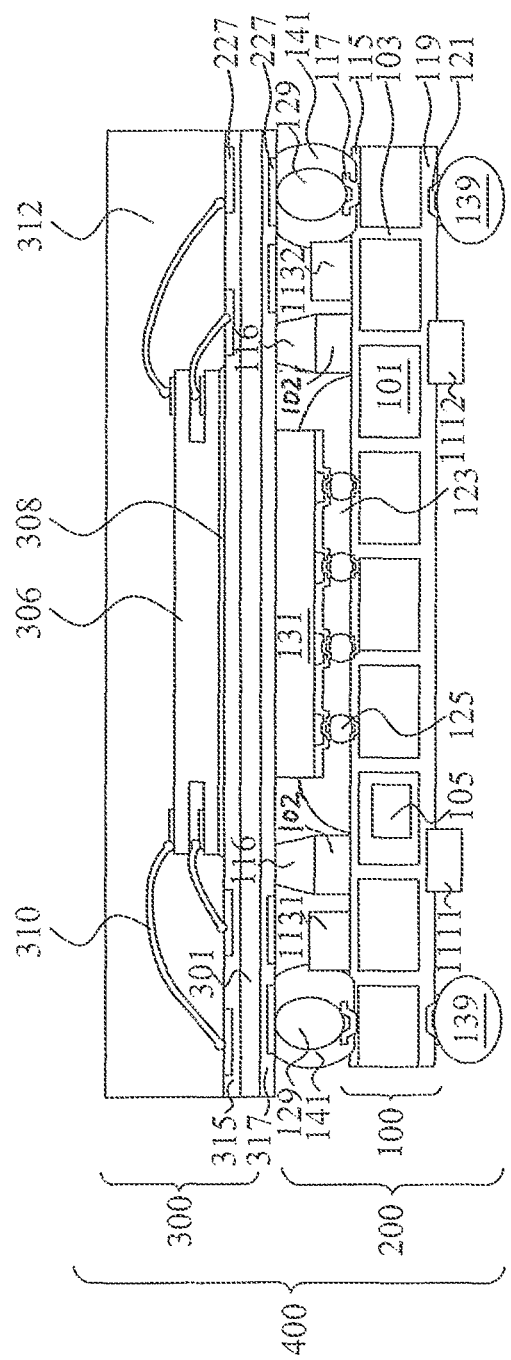
FIGS. 2(a)-2(c) illustrate a top view and a cross-sectional view of an embodiment of a package on package (PoP) formed on an interposer with multiple dams around corners of the interposer.

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

As will be illustrated in the following, methods and apparatus for an interposer with dams around corners of the interposer are disclosed. An interposer may comprise a metal layer above a substrate. A plurality of dams may be formed above the metal layer around each corner of the metal layer. Dams may be formed on both sides of the interposer substrate. A non-conductive dam may be formed on the dam. A dam surrounds an area where connectors such as solder balls may be located to connect to other packages. An underfill may be formed under the package connected to the connector, above the metal layer, and contained within the area surrounded by the dams at the corners, so that the connectors are well protected by the underfill. Such dams may be further formed on a printed circuit board (PCB) to protect connectors at the corners of the PCB.

FIG. 1(a) illustrates a cross-sectional view of an interposer 100. The interposer 100 comprises a substrate 101. A plurality of through vias (TVs) 103 may be formed through the substrate 101. A plurality of devices 105, either active or passive, may be formed within the substrate 101 as well. A first metal layer 115 may be formed above a first side of the substrate 101. First contact pads 117 may be formed above the first metal layer 115. A second metal layer 119 and second contact pads 121 may be formed over a second side of the substrate 101. While layers 115 and 119 are shown schematically as a single continuous layer, one skilled in the art will recognize that this represents various interconnects formed as distinct features within a common layer. Two dams 1131 and 1132 are illustrated in FIG. 1(a) above the first metal layer 115, surrounding an area 1121 and an area 1122 respectively around each corner of the interposer. Two additional dams 1111 and 1112 are illustrated above the second metal layer 119 on the second side of the substrate 101. A contact pad 117 may be located within the areas 1121 and 1122 respectively. Contact pads 121 may be located in various areas separated by the dams 1121 and 1122 on the second side of the substrate. There may be other layers such as a passivation layer, or a polymer layer formed below the first metal layer 115, which are not shown. Each of these structures is discussed in greater detail in the following paragraphs.

As illustrated in FIG. 1(a), the substrate 101 for the interposer 100 may be, e.g., a silicon substrate, doped or undoped, or an active layer of a silicon-on-insulator (SOI) substrate, used to provide support for the interposer 100. However, the substrate 101 may alternatively be a glass substrate, a ceramic substrate, a polymer substrate, or any other substrate that may provide a suitable protection and/or interconnection functionality. These and any other suitable materials may alternatively be used for the substrate 101.

A plurality of devices 105 may be formed within the substrate 101. As one of ordinary skill in the art will recognize, a wide variety of active devices and passive devices such as transistors, capacitors, resistors, inductors and the like may be used to generate the desired structural and functional requirements of the design for the interposer 100. The devices 105 may be formed using any suitable methods either within or else on the surface of the substrate 101.

However, as one of ordinary skill will recognize, the above described substrate 101 with devices 105 is not the only substrate that may be used. Alternative substrates, such as a package substrate or an interposer that does not have devices therein, may alternatively be utilized. These substrates and any other suitable substrates may alternatively be used and are fully intended to be included within the scope of the present embodiments.

Additional metallization layers may be formed over the substrate 101 and the devices 105 to connect the various devices to form functional circuitry. Contact pads may be formed over and in electrical contact with the metallization layers. Furthermore, passivation layers may be formed on the substrate 101 over the metallization layers and the contact pads. Additional polymer layer may be formed on the passivation layer. All those metallization layers, contacts, passivation layers, and polymer layers are not shown in FIG. 1(a).

A plurality of TVs 103 may be formed through the substrate 101. The TVs 103 may be formed by applying and developing a suitable photoresist, and then etching the substrate 101 to generate TV openings. The openings for the TVs 103 at this stage may be formed so as to extend into the substrate 101 to a depth at least greater than the eventual desired height of the finished interposer 100. Accordingly, while the depth is dependent upon the overall design of the interposer 100, the depth may be between about 1 μm and about 700 μm below the surface on the substrate 101, with a preferred depth of about 50 μm. The openings for the TVs 103 may be formed to have a diameter of between about 1 μm and about 100 μm, such as about 6 μm.

Once the openings for the TVs 103 have been formed, the openings for the TVs 103 may be filled with, e.g., a barrier layer and a conductive material. The barrier layer may comprise a conductive material such as titanium nitride, although other materials, such as tantalum nitride, titanium, or the like may alternatively be utilized. The barrier layer may be formed using a chemical vapor deposition (CVD) process, such as plasma enhanced CVD (PECVD). The barrier layer may be formed so as to contour to the underlying shape of the opening for the TVs 103.

The conductive material for the TVs 103 may comprise copper, although other suitable materials such as aluminum, alloys, combinations thereof, and the like, may alternatively be utilized. The conductive material may be formed by depositing a seed layer and then electroplating copper onto the seed layer, filling and overfilling the openings for the TVs 103. Once the openings for the TVs 103 have been filled, excess barrier layer and excess conductive material outside of the openings for the TVs 103 may be removed through a grinding process such as chemical mechanical polishing (CMP), although any suitable removal process may be used.

Once the conductive material is within the openings for the TVs 103, a thinning of the second side of the substrate 101 may be performed in order to expose the openings for the TVs 103 and form the TVs 103 from the conductive material that extends through the substrate 101. In an embodiment, the thinning of the second side of the substrate 101 may leave the TVs 103. The thinning of the second side of the substrate 101 may be performed by a planarization process such as CMP or etching.

However, as one of ordinary skill in the art will recognize, the above described process for forming the TVs 103 is merely one method of forming the TVs 103, and other methods are also fully intended to be included within the scope of the embodiments. For example, forming the openings for the TVs 103, filling the openings for the TVs 103, thinning the second side of the substrate 101, and filling the openings for the TVs 103 with a conductor may also be used. This and all other suitable methods for forming the TVs 103 into the substrate 101 are fully intended to be included within the scope of the embodiments.

Alternatively, the TVs 103 may be formed to extend through layers of the interposer 100 located over the substrate 101 such as the first metal layer 115 (described further below). For example, the TVs 103 may be formed either after the formation of the first metal layer 115 or else even partially concurrently with the first metal layer 115. For example, the openings for the TVs 103 may be formed in a single process step through both the first metal layer 115 and the substrate 101. Alternatively, a portion of the openings for the TVs 103 may be formed and filled within the substrate 101 prior to the formation of the first metal layer 115, and subsequent layers of the openings for the TVs 103 may be formed and filled as each of the first metal layer 115 are individually formed. Any of these processes, and any other suitable process by which the TVs 103 may be formed, are fully intended to be included within the scope of the embodiments.

The first metal layer 115 may be formed over the first side of the substrate 101 to interconnect the first side of the substrate 101 to external devices on the second side of the substrate 101. The first metal layer 115 may be a redistribution layer (RDL). While illustrated in FIG. 1(a) as a single layer of interconnects, the first metal layer 115 may be formed of alternating layers of conductive material and may be formed through any suitable process (such as deposition, damascene, dual damascene, etc.). In an embodiment there may be one or more layers of metallization, but the precise number of layers within the first metal layer 115 is dependent at least in part upon the design of the interposer 100.

The first contact pads 117 may be formed over and in electrical contact with the first metal layer 115. The first contact pads 117 may comprise a layer of conductive material such as aluminum, but other materials, such as copper, titanium, or nickel may alternatively be used. The first contact pads 117 may be formed as an under-bump-metallurgy (UBM) layer. The first contact pads 117 may comprise a plurality of contact pads as shown in FIG. 1(a). Some of the contact pads 117 may be located within the area 1121 around one corner of the interposer 100, some other contact pads 117 may be located within the area 1122 around another corner of the interposer 100, while some other contact pads 117 may be located in the middle of the metal layer 115, outside the areas 1121 and 1122. The first contact pads 117 may be formed using a deposition process, such as sputtering, to form a layer of material (not shown) and portions of the layer of material may then be removed through a suitable process (such as photolithographic masking and etching) to form the first contact pads 117. However, any other suitable process, such as forming an opening, depositing the material for the first contact pads 117, and then planarizing the material, may be utilized to form the first contact pads 117. The first contact pads 117 may be formed to have a thickness of between about 0.5 μm and about 4 μm, such as about 1.45 μm. The first contact pads 117 may comprise multiple sub-layers, not shown.

The second metal layer 119 may be formed over the second side of the substrate 101 to interconnect the second side of the substrate 101 to external contacts. The second metal layer 119 may be a redistribution layer (RDL). While illustrated in FIG. 1(a) as a single layer of interconnects, the second metal layer 119 may be formed of alternating layers of conductive material and may be formed through any suitable process (such as deposition, damascene, dual damascene, etc.). In an embodiment there may be one or more layers of metallization, but the precise number of layers within the second metal layer 119 depends at least in part upon the design of the interposer 100.

The second contact pads 121 may be formed over and in electrical contact with the second metal layer 119 on the second side of the substrate 101. The second contact pads 121 may comprise aluminum, but other materials, such as copper, may alternatively be used. The second contact pads 121 may be formed as an under-bump-metallurgy (UBM) layer. The second contact pads 121 may comprise a plurality of contact pads as shown in FIG. 1(a). The second contact pads 121 may be formed using a deposition process, such as sputtering, to form a layer of material (not shown) and portions of the layer of material may then be removed through a suitable process (such as photolithographic masking and etching) to form the second contact pads 121. However, any other suitable process, such as forming an opening, depositing the material for the second contact pads 121, and then planarizing the material, may be utilized to form the second contact pads 121. The second contact pads 121 may be formed to have a thickness of between about 0.5 μm and about 4 μm, such as about 1.45 μm.

A first dam 1131 may be formed above the first metal layer 115, surrounding an area 1121 around a corner of the interposer 100. A second dam 1132 may be formed above the first metal layer 115, surrounding an area 1122 around another corner of the interposer 100. The distance of the dam 1131 to an edge of the interposer may be about ⅓ of the length of the interposer. The distance of the dam 1132 to another edge of the interposer may be about ⅓ of the length of the interposer. The dams 1131 and 1132 may be of an L shape separating the corners 1121 and 1122 from the rest of the interposer, as shown in FIG. 2(b) in top view. In addition, two more dams 1111 and 1112 are illustrated above the second metal layer 119 above the second side of the substrate 101 around the two corners of the interposer shown in FIG. 1(a). The interposer 100 has four corners and FIG. 1(a) only illustrates the dams 1131 and 1132 above two corners. As illustrated in FIG. 2(b), there may be four such dams around each corner of the four corners of the interposer 100, among which two additional dams around other two corners are not shown in FIG. 1(a).

When the interposer 100 may be used to form a package or a PoP device, an underfill material may be used between a package and the interposer 100, to strengthen the attachment of the die to the interposer, to help to prevent the thermal stresses from breaking the connections between the die and interposer. However, the underfill material may not protect connections well for connectors located at the corners of a package, such as connectors located in the corner areas 1121 and 1122, due to the capillarity for four corner underfill dispensing, which may leave some connectors unprotected by the underfill material. The dams 1131, 1132, 1111, and 1112 can help to constraint the underfill material within the corner area to cover the connectors, and protect the connections.

The dams 1131, 1132, 1111, and 1112, may comprise a conductive material such as aluminum, but other materials, such as copper, titanium, or nickel may alternatively be used. The dams 1131, 1132, 1111, and 1112, may be formed using a deposition process, such as sputtering, to form a layer of material (not shown) and portions of the layer of material may then be removed through a suitable process (such as photolithographic masking and etching) to form the dams. The dams 1131 and 1132 may be formed at the same time as the first contact pads 117. The dams 1111 and 1112 may be formed at the same time as the second contact pads 121. The dams 1131 and 1132 may be formed as part of an under-bump-metallurgy (UBM) layer, just as the first contact pads 117. The dams 1111 and 1112 may be formed as part of an UBM layer, just as the second contact pads 121. In addition, any other suitable process, such as forming an opening, depositing the material for the dams 1131, 1132, 1111, and 1112, and then planarizing the material, may be utilized to form the dams 1131, 1132, 1111, and 1112.

The width, height, or diameter of the dams 1131, 1132, 1111, and 1112 may be about the same as the connector such as a ball (or bump) diameter, or can be as much as 1/10 of the size of the diameter of the connector such as the ball (or bump) diameter. For example, the dams 1131, 1132, 1111, and 1112 may be of a rectangle shape with a width from about 100 um to about 200 um, and a height in a range from about 20 um to about 30 um. The height of the dams 1131, 1132, 1111, and 1112 may be of a similar size of a connector 129 shown in FIG. 1(c), which may be of a diameter size about 200 um. The dams 1131, 1132, 1111, and 1112 may have a narrow, wide, or tapered shape. The bodies of the dams 1131, 1132, 1111, and 1112 may be of a substantially constant thickness. The dams 1131, 1132, 1111, and 1112 may be of other shapes such as a circle, an octagon, a rectangle, an elongated hexagon with two trapezoids on opposite ends of the elongated hexagon, an oval, or a diamond.

FIG. 1(b) illustrates two additional dam segments 102 above the first metal layer 115, which may be used to protect underfill material under a die placed at a center area 114 of the interposer. All other parts of FIG. 1(b) are the same as those parts shown in FIG. 1(a). The two dam segments 102 may be part of a dam 102 surrounding the center 114 of the interposer 100 so that a die may be placed and connected to the center 114 of the interposer surrounded by the dam 102. The dam 102 surrounding the center of the interposer 100 may provide support to control the underfill under a packaged die within the center of the interposer 100, as will be illustrated in FIG. 1(c) and FIG. 1(d). The dam 102 may be made of the same material as for the dams 1131 and 1132, and may be made at the same time as the dams 1131 and 1132.

FIG. 1(c) illustrates a flip-chip package 200 where a die 131 is packaged with the interposer 100. The die 131 is located in the area separated from the corner areas 1121 and 1122 surrounded by the dams 1131 and 1132 respectively. In packaging the die 131, the die 131 is flipped so that connectors 125 contact a plurality of first contact pads 117 above the substrate 101. An underfill 123 is filled under the die 131 and between the die 131 and the surface of the first metal layer 115, in the area between the dams 1131 and 1132. A non-conductive dam 106 may be further formed above the dams 1131 and 1132. A plurality of connectors 129 may be placed above the first contact pads 117 in the areas 1121 and 1122, to connect to other packages to further form a PoP structure. A plurality of connectors 139 may be placed above the second contact pads 121 to connect to a PCB.

The die 131 may be an integrated circuit chip formed from a semiconductor wafer. The die 131 may be any suitable integrated circuit die for a particular application. For example, the die 131 may be a memory chip, such as a DRAM, SRAM, NVRAM, or a logic circuit.

The connectors 125 may provide connections between the first contact pads 117 and the die 131. The connectors 125 may be contact bumps such as micro-bumps or controlled collapse chip connection (C4) bumps and may comprise a material such as tin, or other suitable materials, such as silver or copper. In an embodiment in which the connectors 125 are tin solder bumps, the connectors 125 may be formed by initially forming a layer of tin through any suitable method such as evaporation, electroplating, printing, solder transfer, ball placement, etc., to a preferred thickness of about 100 µm. Once a layer of tin has been formed above the structure, a reflow may be performed in order to shape the material into the desired bump shape.

The underfill 123 between the die 131 and the surface of the first metal layer 115 strengthens the attachment of the die 131 to the interposer 100 and helps to prevent the thermal stresses from breaking the connections between the die 131 and the interposer 100. Generally, the material for the underfill 123, such as organic resin, is selected to control the coefficient of thermal expansion and the shrinkage of underfill 123. Initially, liquid organic resin is applied that flows into the gap between the die 131 and the surface of the first metal layer 115, which subsequently cures to control the shrinkage that occurs in underfill during curing. The dams 1131 and 1132 may prevent the overflowing of the underfill 123 to the corners surrounded by the dams 1131 and 1132.

As shown in FIG. 1(c), a non-conductive dam 106 may be placed above the dams 1131 and 1132 when the height of the dams 1131 and 1132 is not high enough to stop the overflow of the underfill 123. The non-conductive dam 106 may be formed of a variety of non-conductive materials including but not limited to a dispensed organic isolative material such as benzotriazole (BT) or modified silicone, a thermo setting mold compound such as epoxy creasol novolac (ECN) or a modified BT, or a thermo plastic compound such as polyethyl sulfone (PES) polycarbonate or polysulfone. A non-conductive dam material may be deposited above the dams 1131 and 1132 and form a desired shape. The non-conductive dam 106 may be formed using a variety of techniques such as liquid dispense methods, injection transfer molding, and thermo-compression transfer molding. The use of non-conductive dams together with the dams formed above the interposer can make the packaging more flexible, to adjust to different height and volume of the underfill material used in the packaging process.

A plurality of connectors such as solder balls 129 and 139 may be formed above the first contact pads 117 and the second contact pads 121 respectively. The connectors 129 may be used to connect to another package, such as a package 300 shown in FIG. 2(a) and FIG. 3(a). The connectors 139 may be used to connect to a PCB as shown in FIG. 3(a). The number of connectors such as 129 and 139 are only for illustrative purposes, and is not limiting. A connector may be any connection devices such as a solder ball providing an electronic connection. A plurality of connectors such as solder balls 139 or 129 may be arranged in a ball grid array, form the terminals of packaged device and can be attached to a PCB or other circuitry.

Similarly, FIG. 1(d) illustrates a flip-chip package 200 where a die 131 is packaged with the interposer 100 in an area surrounded by a dam 102 above the first metal layer 115. As first illustrated in FIG. 1(b), the dam 102 surrounding the center of the interposer 100 may provide support to control the underfill under a packaged die within the center of the interposer 100. Comparing to the package 200 shown in FIG. 1(c), the additional dam 102 constraints the underfill material under the die 131 within the area surrounded by the dam 102. Similarly to the package shown FIG. 1(c), in packaging the die 131, the die 131 is flipped so that connectors 125 contact a plurality of first contact pads 117 above the substrate 101. An underfill 123 is filled under the die 131 and between the die 131 and the surface of the first metal layer 115, in the area surrounded by the dam 102. A non-conductive dam 106 may be further formed above the dam 102. The more detailed descriptions of FIG. 1(c) can be similarly applied for components of FIG. 1(d).

Figure 2B:
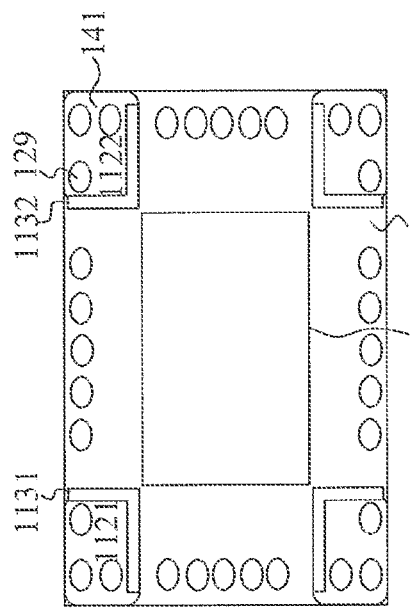
Figure 3A:
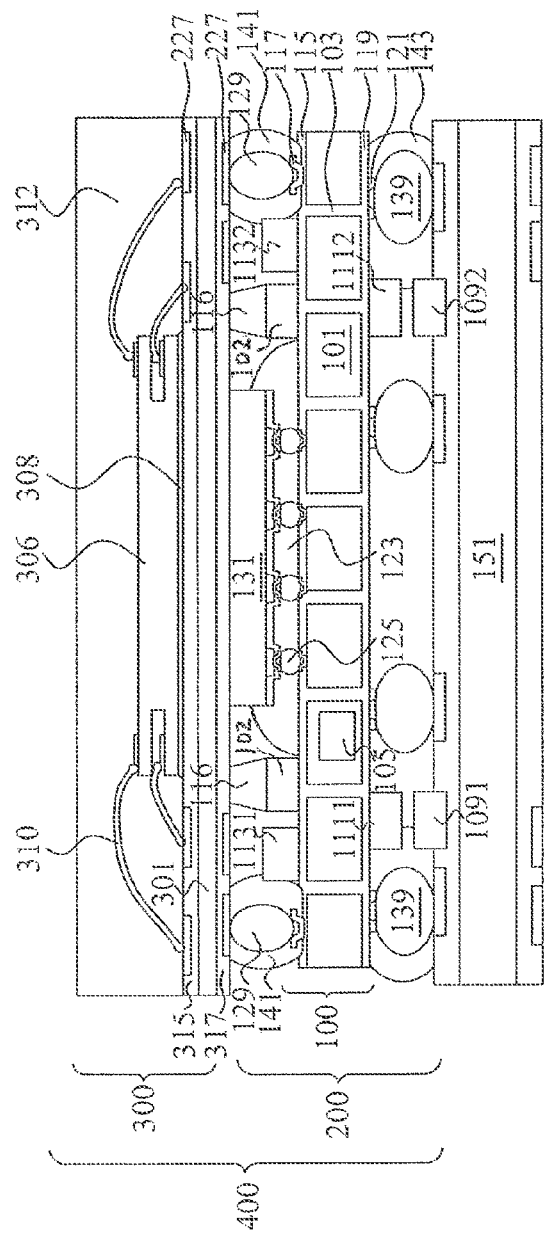
FIGS. 3(a)-3(b) illustrate a top view and a cross-sectional view of an embodiment of a package on package (PoP) attached to a printed circuit board (PCB) with multiple dams around corners of the PCB.

FIG. 2(a) illustrates an embodiment of a PoP structure 400 formed by placing a package 300 on the package 200, where the package 200 is the same package shown in FIG. 1(d). A package shown in FIG. 1(c) may be used to replace the package 200 to form the PoP structure 400. Alternative packages such as a package formed by wire bonding instead of flip-chip technology may also be used to form the PoP structure 400. The package 300 and the package 200 may be electrically coupled by connectors 129 to form the PoP device 400. An underfill 141 may be formed covering the connectors 129 at each corner of the interposer. The underfill 141 may be blocked by the dam 1131 and 1132 respectively on each corner so that the underfill material will not move away from the connectors 129 leaving the connectors 129 unprotected by the underfill material.

The package 300 may have a substrate 301. A first metal layer 317 may be formed on one side of the substrate 301 and a second metal layer 315 may be formed on another side of the substrate 301. A plurality of connectors such as contact pads 227 may be formed on the two metal layers 317 and 315. The contact pads 227 may be used to connect to another package, such as package 200 at the bottom. A first IC die 308 may be mounted on the second metal layer 315. A second IC 306 may be mounted on the first IC 308, separated by an attachment material such as a thermally conductive adhesive, to provide improved thermal conductivity between the dies. Both the first IC 308 and the second IC 306 may be connected to contact pads 227 on the second metal layer 315 using the side electrical interconnections 310. An encapsulant or mold 312 may cover the components such as ICs 306 and 308, the side electrical interconnections 310, the contact pads 227, and the second metal layer 315. Through vias (TVs) (not shown) may be used to provide electrical connections between the die 308 and other circuits through the substrate 301.

In an embodiment, the substrate 301 may be any suitable substrate, such as a silicon substrate, a high-density interconnect, an organic substrate, a ceramic substrate, a dielectric substrate, a laminate substrate, or the like. The dies 308 and 306 may be a memory chip, such as a DRAM, SRAM, NVRAM, or a logic chip for a particular application. There may be a plurality of dies mounted on top of each other or on the side. It should be understood that the structure, placement, and positioning of the die 306 and the die 308 are provided for illustrative purposes only, and accordingly, other embodiments may utilize different structures, placements, and positions.

The first metal layer 317 and the second metal layer 315 may be redistribution layers (RDLs). The side electrical interconnections 310 may be bond wires. The connectors 227 may comprise, for example, contact pads, lead free solder, eutectic lead, conductive pillars, combinations thereof, and/or the like. The encapsulant or mold 312 may be formed over the components to protect the components from the environment and external contaminants. The encapsulant 312 may be formed from a number of materials, such as an elastomer or a rigid resin (thermoset epoxy, silicone and polyurethane), and is used to encapsulate and protect the internal stacking components from shock and vibration.

A set of connectors 129 may be formed on the first contact pads 117 of the package 200 formed on the interposer 100, and further connected to a set of contact pads 227 of the package 300. The connectors 129 may be called as PoP connectors.

An underfill 141 may be formed covering the connectors 129 at each corner of the interposer. The underfill 141 may be blocked by the dams 1131 and 1132 respectively on each corner so that the underfill 141 will not move away from the connectors 129 leaving the connectors 129 unprotected by the underfill 141. The underfill 141 between the package 300 and the surface of the first metal layer 115 strengthens the attachment of the package 300 to the package 200 and helps to prevent the thermal stresses from breaking the connections. Generally, the material for the underfill 141, such as organic resin, is selected to control the coefficient of thermal expansion and the shrinkage of underfill 141. Initially, liquid organic resin is applied that flows into the gap between the package 300 and the surface of the first metal layer 115, which subsequently cures to control the shrinkage that occurs in underfill during curing.

Figure 2C:
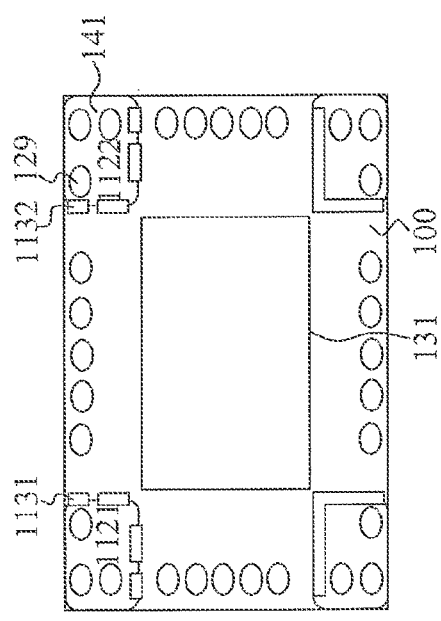

FIG. 2(*b*) illustrates a top view of the PoP structure 400 shown in FIG. 2(*a*). A set of connectors 129 are shown, which are used to connect the package 200 to the package 300. The dams 1131 and 1132 are shown in top view surrounding two corners. The dams 1131 and 1132 may be of an L shape separating the corner areas 1121 and 1122 from the rest of the interposer 100. Other shapes may be possible for the dams 1131 and 1132 as well. For example, a half circle may be used for the dams 1131 and 1132. For any shape that can substantially separate the corner areas where the PoP connectors may be located from other areas of the package may be used. The dams 1131 and 1132 may be a continuous one metal surrounding the area. Alternatively, in some other embodiments, the dams 1131 and 1132 may comprise a plurality of segments surrounding the area, as shown in FIG. 2(*c*). As long as the dams 1131 and 1132 can stop the underfill 141 from moving away from the connectors 129 and leaving the connectors 129 unprotected by the underfill 141, the dams 1131 and 1132 may be used.

As illustrated in FIG. 2(*b*), there may be four such dams around each corner of the four corners of the interposer 100. The die 131 is placed on the interposer 100 in a center area, separated from the four corners by the dam 102. The addition of the dam 102 may further block the underfill 123 from covering other part of the connections.

Figure 3B:
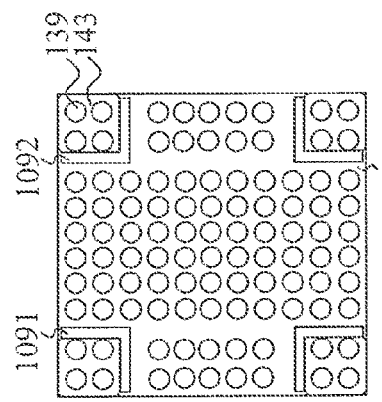

Thereafter, other normal processes may be followed after the completion of the formation of the PoP structure 400. For example, the PoP structure 400 may be attached to a printed circuit board (PCB) 151 through the connectors 139 at the package 200 as shown in FIG. 3(*a*). The PCB 151 may be a thin board made of fiberglass or a similar material. Electrical wires are "printed" onto the board, connecting various components and packages such as the package 200 and the package 300 shown in FIG. 3(*a*). Alternatively, the PoP structure 400 may be placed on a high-density interconnect, a silicon substrate, an organic substrate, a ceramic substrate, a dielectric substrate, a laminate substrate, another semiconductor package, or the like.

As illustrated in FIG. 3(*a*), the PoP structure 400 may be electrically coupled by connectors 139 to the PCB 151. Dams 1091 and 1092 may be formed on the PCB 151, similar to the dams 1131 and 1132 formed on the interposer 100, to separate corners of the PCB from the rest part of the PCB. An underfill 143 may be formed covering the connectors 139 at each corner of the PCB. The underfill 143 may be blocked by the dam 1091 and 1092 respectively on each corner so that the underfill will not move away from the connectors 139, leaving the connectors 139 unprotected by the underfill 143. The dams 1091 and 1092 on the PCB, and the dams 1111 and 1112 on the second surface of the interposer 100 can help to constraint the underfill 143 within the corner area to cover the connectors 139, and protect the connections.

The dams 1091 and 1092 formed on the PCB 151 may be located in a similar position as the medal dams 1111 and 1112 located on the interposer 100, so that the dams 1091 is corresponding to dam 1111, and the dam 1092 is corresponding to the dam 1112. Together they form a better protection for the underfill materials to cover the connectors 139 at each corner. The dams 1091 and 1092 may be located at a point around ⅓ of the length of the PCB measured from the edge of the PCB.

A top view of the PoP structure 400 attached to the PCB 151 is shown in FIG. 3(*b*). The PCB 151 has four corners shown in FIG. 3(*b*), and FIG. 3(*a*) only illustrates the dams 1091 and 1092 on two corners. There may be two additional dams around other two corners as well. The dams 1091 and 1092 may be of an L shape separating the corner from the rest of the PCB. As illustrated in FIG. 3(*b*), there may be four such dams around each corner of the four corners of the PCB 151. The dams around corners of the PCB block the underfill 143 within the corner area to cover the connectors 139.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A device, comprising:
    a substrate;
    a first metal layer above a first surface of a substrate;
    a first contact pad above the first metal layer and in a first corner area; and a first dam above the first metal layer, the first dam surrounding the first corner area and having an upper surface higher than a top-most surface of the first corner area.

2. The device of claim 1, further comprising a non-conductive dam atop the first dam.

3. The device of claim 1, further comprising
a connector above the first contact pad;
a package connected to the connector, wherein the package comprises a second substrate, and a die connected to the second substrate; and
an underfill under the package, above the first metal layer, covering the connector, and contained within the first area surrounded by the first dam.

4. The device of claim 1, further comprising:
a second metal layer above a second surface of the substrate;
a second contact pad above the second metal layer; and
a second dam above the second metal layer, wherein the second dam surrounds a second area around a second corner of the second metal layer, and the second contact pad is within the second area.

5. The device of claim 1, wherein the first dam comprises a plurality of discontinuous metal segments surrounding the first area around the first corner.

6. The device of claim 1, further comprising a central dam above the first metal layer surrounding an area around a center of the first metal layer.

7. The device of claim 1, wherein the first dam is of a rectangle shape with a height in a range from about a size of a diameter of a connector attached to the substrate to about 1/10 of the size of the diameter of the connector.

8. A device, comprising:
a substrate having a corner region and a central region;
a first contact pad located in the corner region;
a first dam surrounding the corner region; and
a second dam surrounding the central region, the second dam having a topmost surface extending above a topmost surface of the central region.

9. The device of claim 8, further comprising a first metal layer above the topmost surface of the substrate.

10. The device of claim 8, wherein the first dam comprises a first layer of conductive material and a second layer of non-conductive material selected from a group consisting essentially of benzotriazole (BT), modified silicone, epoxy creasol novolac (ECN), modified BT, polyethyl sulfone (PES) polycarbonate, polysulfone, and combinations thereof.

11. The device of claim 9, further comprising:
a second metal layer above a bottommost surface of the substrate;
a second contact pad above the second metal layer; and
a second dam above the second metal layer, wherein the second dam surrounds a second area around a second corner of the second metal layer, and the second contact pad is within the second area.

12. The device of claim 9, further comprising:
a connector above the first contact pad;
a package connected to the connector, wherein the package comprises a substrate, and a die connected to the substrate; and
an underfill under the package, above the first metal layer, covering the connector, and contained within a first area surrounded by the first dam.

13. A device, comprising:
a substrate with a first surface and a second surface;
a first contact pad in a first corner of the first surface of the substrate;
a first dam surrounding the first corner;
a connector above the first contact pad; and
an underfill covering the connector, and contained within the first corner surrounded by the first dam.

14. The device of claim 13, further comprising a first metal layer above the first surface of the substrate and contacting the first contact pad.

15. The device of claim 13, further comprising a package connected to the connector, wherein the package comprises a second substrate, and a die connected to the second substrate.

16. The device of claim 15, wherein the underfill extends under the package.

17. The device of claim 13, further comprising:
a second contact pad in a second corner of the second surface of the substrate;
a second dam surrounding the second corner; and
a second connector above the second contact pad.

18. The device of claim 17, further comprising a second underfill covering the second connector, and contained within the second corner surrounded by the second dam.

19. The device of claim 13, further comprising a non-conductive dam atop the first dam.

20. The device of claim 13, further comprising a central dam surrounding a central portion of the first surface of the substrate.

* * * * *